United States Patent
Cha et al.

(10) Patent No.: US 8,749,298 B2
(45) Date of Patent: Jun. 10, 2014

(54) ANTI-FUSE CIRCUIT

(75) Inventors: Jin Youp Cha, Icheon-si (KR); Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/585,972

(22) Filed: Aug. 15, 2012

(65) Prior Publication Data
US 2013/0265101 A1    Oct. 10, 2013

(30) Foreign Application Priority Data

Apr. 5, 2012    (KR) .................. 10-2012-0035391

(51) Int. Cl.
*H01H 37/76*    (2006.01)
*H01H 85/00*    (2006.01)

(52) U.S. Cl.
USPC ............................................. 327/525

(58) Field of Classification Search
USPC ...................... 327/525–526; 365/225.7
See application file for complete search history.

(56) References Cited

U.S. PATENT DOCUMENTS

| | | | |
|---|---|---|---|
| 5,530,674 A * | 6/1996 | McClure et al. | 365/201 |
| 5,828,624 A * | 10/1998 | Baker et al. | 365/230.06 |
| 7,091,768 B2 * | 8/2006 | Lee | 327/525 |
| 7,567,449 B2 * | 7/2009 | Paak et al. | 365/96 |
| 7,701,226 B2 * | 4/2010 | Kaneko | 324/550 |
| 8,253,475 B2 * | 8/2012 | Lin | 327/525 |
| 2010/0309709 A1 * | 12/2010 | Shin et al. | 365/96 |

FOREIGN PATENT DOCUMENTS

KR    1020060108954 A    10/2006

* cited by examiner

*Primary Examiner* — Quan Tra
(74) *Attorney, Agent, or Firm* — William Park & Associates Patent Ltd.

(57) ABSTRACT

An anti-fuse circuit includes: an anti-fuse unit including an anti-fuse capable of being programmed in response to a rupture signal and configured to generate a fuse signal corresponding to a state of the anti-fuse; a dummy fuse unit including a dummy fuse and configured to generate a dummy fuse signal corresponding to a state of the dummy fuse; and a blocking unit configured to output the fuse signal as a fuse output signal in response to a state of the dummy fuse signal.

15 Claims, 3 Drawing Sheets

US 8,749,298 B2

ANTI-FUSE CIRCUIT

CROSS-REFERENCES TO RELATED APPLICATION

The present application claims priority under 35 U.S.C. §119(a) to Korean application number 10-2012-0035391 filed on Apr. 5, 2012, in the Korean Intellectual Property Office, which is incorporated herein by reference in its entirety.

BACKGROUND

1. Technical Field

The present invention relates generally to a semiconductor integrated circuit, and more particularly, to an anti-fuse circuit.

2. Related Art

When, any one failed unit cell among numerous unit cells of is a semiconductor memory apparatus is detected, during a fabrication process for the semiconductor memory apparatus, the semiconductor memory apparatus may not function to retain memory, and thus is discarded as a defective product. However, it is inefficient to discard the entire semiconductor memory apparatus and designate it as a defective product even though the defects have only occurred in certain unit cells thereof. Therefore, the semiconductor memory apparatus may be restored by replacing the failed unit cells with redundancy cells prepared therein, which makes it possible to improve the yield of semiconductor memory apparatuses.

A repair operation using redundancy cells may be performed at a wafer level and a package level. At the wafer level, a fuse is used to perform a repair operation. For example, the repair operation using a fuse may include the method of cutting a fuse existing in a line connected to a row or column having a failed cell by passing an over current, a method of burning a fuse using laser beams, a method of connecting junctions using laser beams, and a method of programming a fuse through EPROM, in order to replace failed cells with redundancy cells.

On the other hand, the repair operation using a fuse cannot be performed at the package level. Therefore, an anti-fuse may be adopted to perform a repair operation. The anti-fuse is a resistive fuse element having an electrical characteristic opposite the fuse. In general, the anti-fuse may be formed of a thin dielectric material such as a complex in which a dielectric such as $SiO_2$, silicon nitride, tantalum oxide, or ONO (silicon dioxide-silicon nitride-silicon dioxide) is interposed between two conductors. The anti-fuse is electrically open in a normal state. However, when a high voltage is applied to destroy the dielectric between the conductors, the anti-fuse is shorted. That is, when a failed cell is to be replaced at the package level, a programming operation of applying a high voltage to an anti-fuse circuit is performed. After the programming operation, the anti-fuse is shorted to replace the failed cell with a redundancy cell.

FIG. 1 is a conventional anti-fuse circuit provided in a semiconductor apparatus.

In order to perform a repair operation on a memory cell, an activated rupture signal RUP is applied to the anti-fuse circuit to program an anti-fuse corresponding to the memory cell. The anti-fuse is electrically open in a normal state. However, when a high voltage (i.e., VHIGH) is applied to destroy a dielectric of the anti-fuse, the anti-fuse is shorted. FIG. 1 illustrates a gate oxide anti-fuse which looses the property of an NMOS transistor and has the property of a conductor when receiving a high voltage through a gate terminal thereof. In addition, however, various types of anti-fuses may be used.

The conventional anti-fuse circuit includes a fuse unit 10, a reset unit 40, and an output unit 50.

The fuse unit 10 may include an inverter IV1, a PMOS transistor P1, a pass gate PG1, an anti-fuse AF1, the reset unit 40 may include a PMOS transistor P2, and the output unit 50 may is include an inverter IV2.

The reset unit 40 is configured to receive a power-up signal PWR and reset an output node ND to an external voltage level VDD, during initial power up. Therefore, before a programming operation is performed, a deactivated fuse signal FUSE is generated through the output unit 50.

On the other hand, when the rupture signal RUP is applied, the anti-fuse AF1 of the fuse unit 10 is programmed, and the pass gate PG1 is enabled to lower the voltage level of the output node ND to a ground voltage level VSS. Therefore, after the programming operation, the activated fuse signal FUSE is generated through the output unit 50.

That is, the conventional anti-fuse circuit generates the activated fuse signal by programming the anti-fuse, thereby replacing the corresponding memory cell with a redundancy cell.

In the conventional anti-fuse circuit, however, the anti-fuse sensitively reacts with external environments. Therefore, although a programming operation was not performed, the anti-fuse may be destroyed. Furthermore, since a programming operation is performed at the package level, the anti-fuse resistance after the programming operation may deviate from a sensing range. In this case, a false fuse signal may be generated to cause a malfunction of the entire semiconductor apparatus.

SUMMARY

In one embodiment of the present invention, an anti-fuse circuit includes: an anti-fuse unit including an anti-fuse capable of being programmed in response to a rupture signal and configured to generate a fuse signal corresponding to a state of the anti-fuse; a dummy fuse unit including a dummy fuse and configured to generate a dummy fuse signal corresponding to a state of the dummy fuse; and a blocking unit configured to output the fuse signal as a fuse output signal in response to a state of the dummy fuse signal.

In another embodiment of the present invention, an anti-fuse circuit includes: a first anti-fuse unit including a first anti-fuse capable of being programmed in response to a rupture signal and configured to generate a first fuse signal corresponding to a state of the first anti-fuse; a second anti-fuse unit including a second anti-fuse capable of being programmed in response to the rupture signal and configured to generate a second fuse signal corresponding to a state of the second anti-fuse; a first comparison unit configured to compare a voltage level of the first fuse signal to a reference voltage and generate a first comparison signal; a second comparison unit configured to compare a voltage level of the second fuse signal to the reference voltage and generate a second comparison signal; and an output unit configured to generate a fuse output signal that is activated when any one of the first and second comparison signals is activated.

In another embodiment of the present invention, an anti-fuse circuit includes: a first anti-fuse unit configured to generate a is first fuse signal corresponding to a first anti-fuse state and a first dummy fuse unit configured to generate a first dummy fuse signal corresponding to a first dummy fuse state; a second anti-fuse unit configured to generate a second fuse signal corresponding to a second anti-fuse state and a second dummy fuse unit configured to generate a second dummy fuse signal corresponding to a second dummy fuse state; a first comparison unit configured to compare a voltage level of the first fuse signal to a reference voltage and generate a first comparison signal; a second comparison unit configured to compare a voltage level of the second fuse signal to the reference voltage and generate a second comparison signal; a first blocking unit configured to transmit the first comparison signal in response to a state of the first dummy fuse signal; a second blocking unit configured to transmit the second comparison signal in response to a state of the second dummy fuse signal; and an output unit configured to generate a fuse output signal that is activated when any one of output signals of the first and second blocking units is activated.

BRIEF DESCRIPTION OF THE DRAWINGS

Features, aspects, and embodiments are described in conjunction with the attached drawings, in which.

DETAILED DESCRIPTION

Hereinafter, an anti-fuse circuit according to the present invention will be described below with reference to the accompanying drawings through various embodiments.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
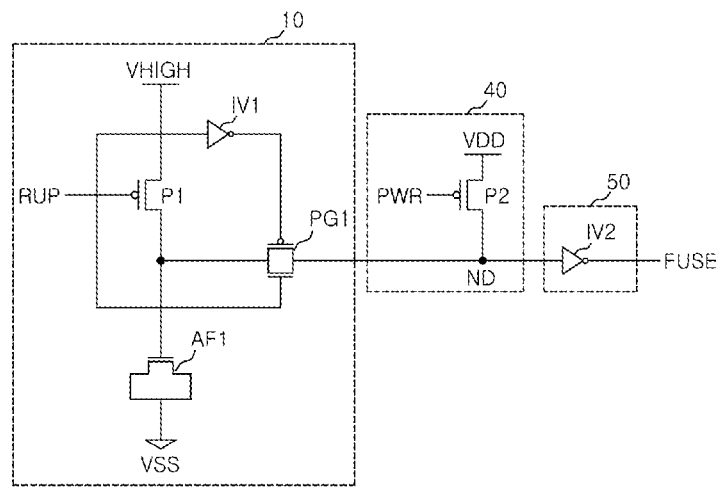
FIG. 1 is a conventional anti-fuse circuit provided in a semiconductor apparatus.
Figure 2:
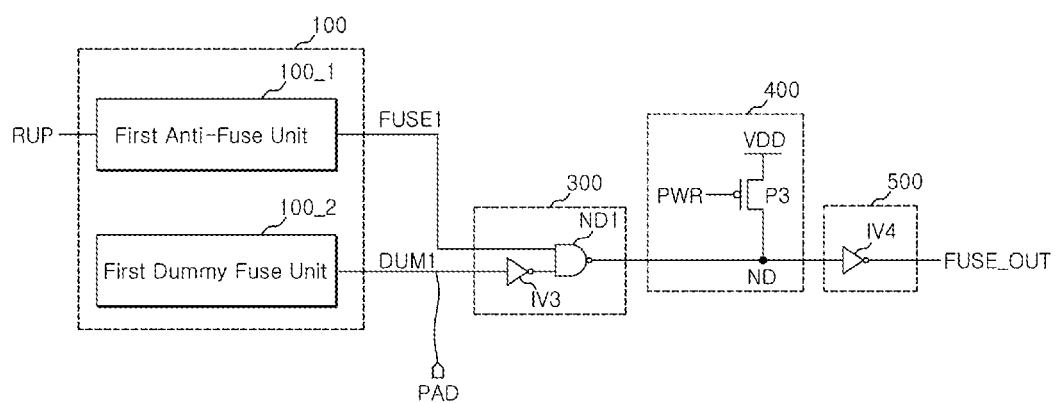
FIG. 2 is a circuit diagram of an example of an anti-fuse is circuit according to one embodiment of the present invention.

FIG. 2 is a circuit diagram of an anti-fuse circuit according to one embodiment of the present invention.

The anti-fuse circuit may include a first anti-fuse set 100, a blocking unit 300, a reset unit 400, and an output unit 500.

The first anti-fuse set 100 may include a first anti-fuse unit 100_1 and a first dummy fuse unit 100_2.

The first anti-fuse unit 100_1 may be the conventional anti-fuse circuit, and may include an anti-fuse capable of being (not illustrated) programmed in response to a rupture signal RUP, and may be configured to generate a first fuse signal FUSE1 corresponding to the state of the anti-fuse. The rupture signal RUP may be applied to an anti-fuse unit corresponding to a failed memory cell, in order to perform a repair operation on the failed memory cell. The anti-fuse may be electrically open in a normal state. However, when a high voltage is applied to destroy a dielectric of the anti-fuse, the anti-fuse may be shorted. The anti-fuse may include a gate oxide is anti-fuse which looses the property of an NMOS transistor and has the property of a conductor when receiving a high voltage through a gate terminal thereof. In addition, however, various other types of anti-fuses may be used.

The first dummy fuse unit 100_2 may include a dummy fuse (not illustrated) corresponding to the anti-fuse of the first anti-fuse unit 100_1, and may be configured to generate a first dummy fuse signal DUM1 corresponding to the state of the dummy fuse.

As described above, an anti-fuse may be so sensitive as to be significantly influenced by external environments. Therefore, an anti-fuse that may be included in the first anti-fuse unit 100_1 may be destroyed even though a programming operation was not performed. At this time, since a dummy fuse of the first dummy fuse unit 100_2 adjacent to the first anti-fuse unit 100_1 may be under the same environment, the dummy fuse may also be destroyed in the same manner. Therefore, when the first dummy fuse unit 100_2 generates the activated first dummy fuse signal DUM1, it may be determined that an error occurred in the first anti-fuse unit 100_1.

Thus, the first anti-fuse unit 100_1 may generate the deactivated first fuse signal FUSE1 when the anti-fuse included in the first anti-fuse unit 100_1 is electrically open, and may generate the activated first fuse signal FUSE1 when the anti-fuse is shorted. Furthermore, the first dummy fuse unit 100_2 may generate the deactivated first dummy fuse signal DUM1 when the dummy fuse included in the first dummy fuse unit 100_2 is electrically open, and may generate the activated first dummy fuse signal DUM1 when the dummy fuse is shorted.

The blocking unit 300 may be configured to control the transmission of the first fuse signal FUSE1 in response to the state of the first dummy fuse signal DUM1.

That is, when the first dummy fuse signal DUM1 is deactivated, it may indicate that no error based on external environments has occurred in the anti-fuse. Therefore, the blocking unit 300 may transmit the first fuse signal FUSE1 to the output node ND. On the other hand, when the first dummy fuse signal DUM1 is activated, it may indicate that an error has occurred in the anti-fuse.

Therefore, the block unit 300 may block the transmission of the first fuse signal FUSE1.

Also, the blocking unit 300 may include an inverter IV3 and a NAND gate ND1. The inverter IV3 may be configured to invert the first dummy fuse signal DUM1, and the NAND gate ND1 may be configured to receive the first fuse signal FUSE1 and an output signal of the inverter IV3.

The output unit 500 may be configured to buffer an output signal of the blocking unit 300 and to finally output the buffered signal as a fuse output signal FUSE_OUT. Also, the output unit 500 may include an inverter IV4.

The reset unit 400 may be configured to apply an external voltage VDD to the output node ND in response to a power-up signal PWR, during an initial power up. Also, the reset unit 400 may include a PMOS transistor P3 configured to receive the power-up signal PWR and apply the external voltage VDD.

The anti-fuse circuit according to the embodiment of the present invention may generate the deactivated fuse output signal FUSE_OUT according to the reset operation, and then may generate the activated fuse output signal FUSE_OUT when the rupture signal RUP is applied to short the corresponding anti-fuse. When the activated fuse output signal FUSE_OUT is outputted, the corresponding failed memory cell may be replaced with a redundancy cell.

On the other hand, when the dummy fuse is destroyed, to generate the activated first dummy fuse signal DUM1, the anti-fuse circuit may generate the deactivated fuse output signal FUSE_OUT even though the anti-fuse may be shorted. Accordingly, the anti-fuse circuit may block a repair operation which may be performed on a normal memory cell.

At this time, the anti-fuse circuit may directly output the first dummy fuse signal DUM1 to a pad PAD through a separate output line, thereby monitoring whether or not an error occurred in the anti-fuse included in the first anti-fuse unit 100_1.

Figure 3:
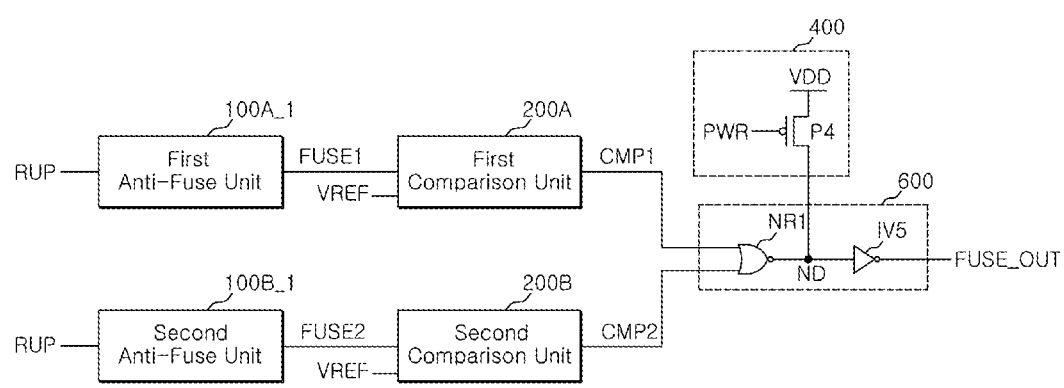
FIG. 3 is a circuit diagram of an example of an anti-fuse circuit according to another embodiment of the present invention.

FIG. 3 is a circuit diagram of an example of an anti-fuse circuit according to another embodiment of the present invention.

The anti-fuse circuit may include first and second anti-fuse units 100A_1 and 100B_1, respectively, first and second comparison units 200A and 200B, respectively, a reset unit 400, and an output unit 600.

The first anti-fuse unit 100A_1 may include a first anti-fuse capable of being (not illustrated) programmed in response to a rupture signal RUP, and may be configured to generate a first fuse signal FUSE1 corresponding to the state of the first anti-fuse.

The second anti-fuse unit 100B_1 may include a second anti-fuse capable of being (not illustrated) programmed in response to the rupture signal RUP, and may be configured to generate a second fuse signal FUSE2 corresponding to the state of the second anti-fuse.

The first comparison unit 200A may be configured to compare the voltage level of the first fuse signal FUSE1 to a reference voltage VREF and generate a first comparison signal CMP1.

The second comparison unit 200B may be configured to compare the voltage level of the second fuse signal FUSE2 to the reference voltage VREF and generate a second comparison signal CMP2.

The output unit 600 may be configured to generate the activated fuse output signal FUSE_OUT when any one of the first and second comparison signals CMP1 and CMP2 is activated.

Since the anti-fuse circuit may perform a programming operation at the package level, a programming operation for an anti-fuse may not be performed with precision. That is, the anti-fuse resistance after the programming operation may deviate from a sensing range. When the anti-fuse included in the first anti-fuse unit is normally programmed, the voltage level of the first fuse signal FUSE1 may be recognized to be activated to a high voltage level. On the other hand, when the anti-fuse is not normally programmed, the voltage level of the first fuse signal FUSE1 may be recognized to be deactivated to a low voltage level. In the latter case, when the voltage level of the first fuse signal FUSE1 is finally outputted as a fuse output signal FUSE_OUT, the entire semiconductor apparatus may malfunction because a repair operation for a failed memory cell is not performed.

In this embodiment of the present invention, when any one of the fuse signals FUSE1 and FUSE2 outputted from the two anti-fuse units 100A_1 and 100B_1 is equal to or higher than the reference voltage VREF, the anti-fuse circuit may generate the fuse output signal FUSE_OUT.

Additionally, the first comparison unit 200A may generate the activated first comparison signal CMP1 when the voltage level of the first fuse signal FUSE1 is greater than the reference voltage VREF, and may generate the deactivated first comparison signal CMP1 when the voltage level of the first fuse signal FUSE1 is less than the reference voltage VREF.

The second comparison unit 200B may generate the activated second comparison signal CMP2 when the voltage level of the second fuse signal FUSE2 is greater than the reference voltage VREF, and may generate the deactivated second comparison signal CMP2 when the voltage level of the second fuse signal FUSE2 is less is than the reference voltage VREF.

Specifically, the output unit 600 may include a NOR gate NR1 and an inverter IV5. The NOR gate NR1 may be configured to receive the first and second comparison signals CMP1 and CMP2, perform a NOR operation on the received signals, and output the operation result to an output node ND. The inverter IV5 may be configured to invert an output signal of the NOR gate NR1 and output the inverted signal as the fuse output signal FUSE_OUT. Therefore, when any one of the first and second comparison signals CMP1 and CMP2 is activated, the activated fuse output signal FUSE_OUT may be generated.

The reset unit 400 may be configured to apply an external voltage VDD to the output node ND in response to a power-up signal PWR during initial power up. Additionally, the reset unit 400 may include a PMOS transistor P4 configured to receive the power-up signal PWR and apply the external voltage VDD.

The anti-fuse circuit according to the embodiment of the present invention may generate the deactivated fuse output signal FUSE_OUT according to the reset operation, and then it may generate the activated fuse output signal FUSE_OUT when any one of the first and second fuse units 100A_1 and 100B_1 are normally programmed in response to the rupture signal RUP.

Figure 4:
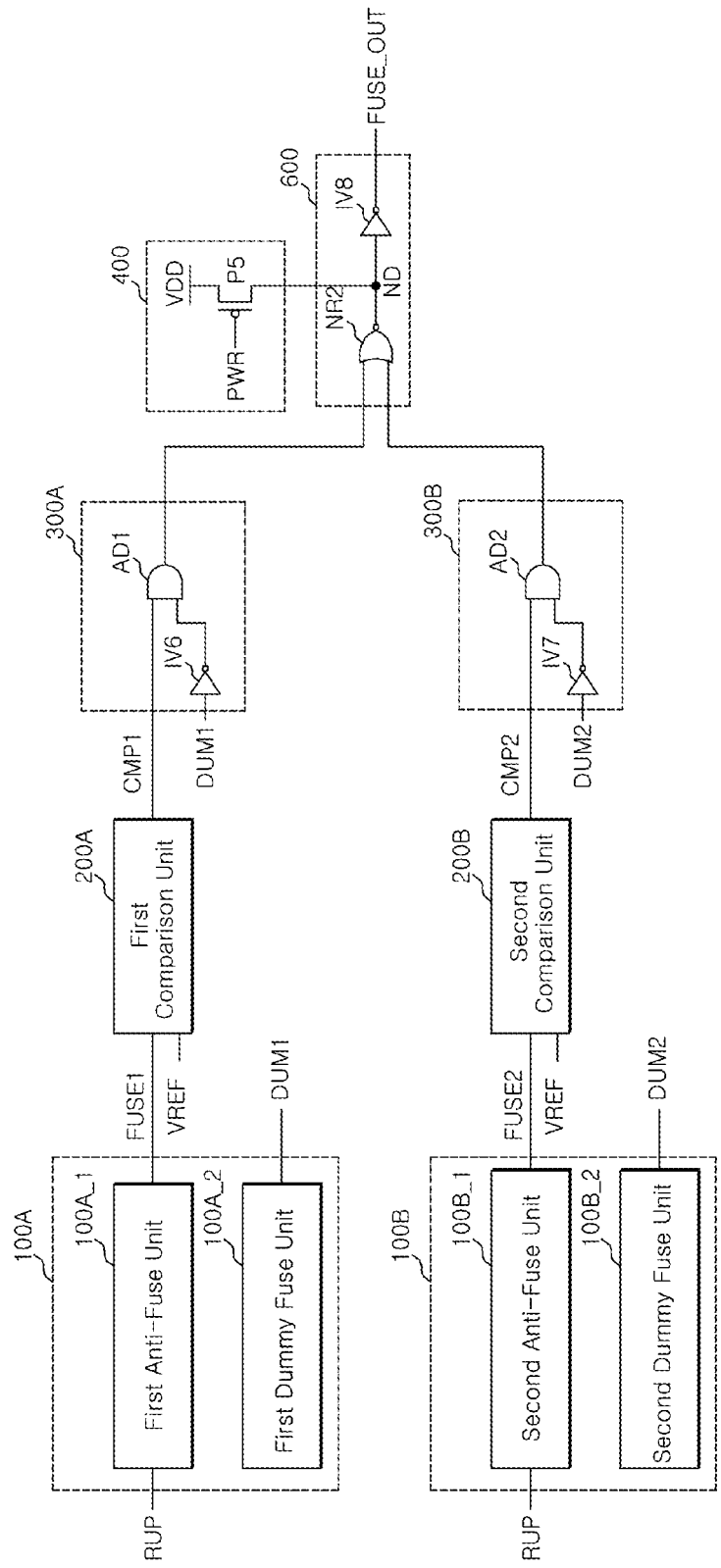
FIG. 4 is a circuit diagram of an example of an anti-fuse circuit according to another embodiment of the present invention.

FIG. 4 is a circuit diagram of an example of an anti-fuse circuit according to another embodiment of the present invention.

The anti-fuse circuit may include a first anti-fuse set 100A, a is second anti-fuse set 100 6, first and second comparison units 200A and 200B, respectively, first and second blocking units 300A and 300B, respectively, a reset unit 400, and an output unit 600.

The first anti-fuse set 100A may include a first anti-fuse unit 100A_1 and a first dummy fuse unit 100A_2.

The first anti-fuse unit 100A_1 may include a first anti-fuse capable of being (not illustrated) programmed in response to a rupture signal RUP, and may be configured to generate a first fuse signal FUSE1 corresponding to the state of the first anti-fuse.

The first dummy fuse unit 100A_2 may include a first dummy fuse (not illustrated) corresponding to the first anti-fuse of the first anti-fuse unit 100A_1, and may be configured to generate a first dummy fuse signal DUM1 corresponding to the state of the first dummy fuse.

Additionally, the first anti-fuse unit 100A_1 may generate the deactivated first fuse signal FUSE1 when the first anti-fuse included in the first anti-fuse unit 100A_1 is electrically open, and may generate the activated first fuse signal FUSE1 when the first anti-fuse is shorted. Furthermore, the first dummy fuse unit 100A_2 may generate the deactivated first dummy fuse signal DUM1 when the first dummy fuse included in the first dummy fuse unit 100A_2 is electrically open, and may generate the activated first dummy fuse signal DUM1 when the first dummy fuse is shorted.

The second anti-fuse set 100B may include a second anti-fuse unit 100B_1 and a second dummy fuse unit 100B_2.

The second anti-fuse unit 100B_1 may include a second anti-fuse capable of being (not illustrated) programmed in response to the rupture signal RUP, and may be configured to generate a second fuse signal FUSE2 corresponding to the state of the second anti-fuse.

The second dummy fuse unit 100B_2 may include a second dummy fuse (not illustrated) corresponding to the second anti-fuse of the second anti-fuse unit 100B_1, and may be configured to generate the second dummy fuse signal DUM2 corresponding to the state of the second dummy fuse.

Additionally, the second anti-fuse unit 100B_1 may generate the deactivated second fuse signal FUSE2 when the second anti-fuse included in the second anti-fuse unit 100B_1 is electrically open, and may generate the activated second fuse signal FUSE2 when the second anti-fuse is shorted. Furthermore, the second dummy fuse unit 100B_2 may generate the deactivated second dummy fuse signal DUM2 when the second dummy fuse included in the second dummy fuse unit 100B_2 is electrically open, and may generate the activated second dummy fuse signal DUM2 when the second dummy fuse is shorted.

The first comparison unit 200A may be configured to compare the voltage level of the first fuse signal FUSE1 to a reference voltage VREF and generate a first comparison signal CMP1. Additionally, the first comparison unit 200A may generate the activated first comparison signal CMP1 when the voltage level of the first fuse signal FUSE1 is greater than the reference voltage VREF, and may generate the deactivated first comparison signal CMP1 when the voltage level of the first fuse signal FUSE1 is less than the reference voltage VREF.

The second comparison unit 200B may be configured to compare the voltage level of the second fuse signal FUSE2 to the reference voltage VREF and generate the second comparison signal CMP2. Additionally, the second comparison unit 200B may generate the activated second comparison signal CMP2 when the voltage level of the second fuse signal FUSE2 is greater than the reference voltage VREF, and may generate the deactivated second comparison signal CMP2 when the voltage level of the second fuse signal FUSE2 is less than the reference voltage VREF.

The first blocking unit 300A may be configured to control the transmission of the first comparison signal CMP1 in response to the state of the first dummy fuse signal DUM1.

That is, when the first dummy fuse signal DUM1 is deactivated, it may indicate that no error based on external environments occurred in the first anti-fuse. Therefore, the first blocking unit 300A transmits the first comparison signal CMP1 to the output unit 600. On the other hand, when the first dummy fuse signal DUM1 is activated, it may indicate that an error occurred in the first anti-fuse. Therefore, the first blocking unit 300A may block the transmission of the first comparison signal CMP1.

Additionally, the first blocking unit 300A may include an inverter IV6 and an AND gate AD1. The inverter IV6 may be configured to invert the first dummy fuse signal DUM1, and the AND gate AD1 may be configured to receive the first comparison signal CMP1 and an output signal of the inverter IV6.

The second blocking unit 300B may be configured to control the transmission of the second comparison signal CMP2 in response to the state of the second dummy fuse signal DUM2.

That is, when the second dummy fuse signal DUM2 is deactivated, it may indicate that no error based on external environments occurred in the second anti-fuse. Therefore, the second blocking unit 300B may transmit the second comparison signal CMP2 to the output unit 600. On the other hand, when the second dummy fuse signal DUM2 is activated, it may indicate that an error occurred in the second anti-fuse. Therefore, the second blocking unit 300B blocks the transmission of the second comparison signal CMP2.

Additionally, the second blocking unit 300B may include an inverter IV7 and an AND gate AD2. The inverter IV7 may be configured to invert the second dummy fuse signal DUM2, and the AND gate AD2 may be configured to receive the second comparison signal CMP2 and an output signal of the inverter IV7.

The output unit 600 may be configured to generate an activated fuse output signal FUSE_OUT when any one of the output signals of the first and second blocking units 300A and 300B is activated.

Additionally, the output unit 600 may include a NOR gate NR2 and an inverter IV8. The NOR gate NR2 may be configured to receive the output signals of the first and second blocking units 300A and 300B, perform a NOR operation on the received signals, and output the operation result to an output node ND. The inverter IV8 may be configured to invert an output signal of the NOR gate NR2 and output the inverted signal as the fuse output signal FUSE_OUT. Therefore, when any one of the output signals of the first and second blocking units 300A and 300B is activated, the output unit 600 may generate the activated fuse output signal FUSE_OUT.

The reset unit 400 may be configured to apply an external voltage VDD to the output node ND in response to a power-up signal PWR, during initial power up. Additionally, the reset unit 400 may include a PMOS transistor P5 configured to receive the power-up signal PWR and apply an external voltage VDD.

The anti-fuse circuit according to the embodiment of the present invention may generate the deactivated fuse output signal FUSE_OUT according to the reset operation, and then it may generate the activated fuse output signal FUSE_OUT when any one of the first and second anti-fuse units 100A_1 and 100B_1 is normally programmed in response to the rupture signal RUP.

On the other hand, when the first or second dummy fuse is destroyed to generate the activated first or second dummy fuse signal DUM1 or DUM2, the anti-fuse circuit may generate the deactivated fuse output signal FUSE_OUT even though the first or is second anti-fuse was shorted. Therefore, the anti-fuse circuit may block a repair operation which may be performed on a normal memory cell.

At this time, the anti-fuse circuit may directly output the first or second dummy fuse signal DUM1 or DUM2 to a pad PAD through a separate output line, thereby monitoring whether or not an error occurred in the first or second anti-fuse included in the first or second anti-fuse unit 100A_1 or 100B_1.

While certain embodiments have been described above, it will be understood to those skilled in the art that the embodiments described are by way of example only. Accordingly, the anti-fuse circuit described herein should not be limited based on the described embodiments. Rather, the anti-fuse circuit described herein should only be limited in light of the claims that follow when taken in conjunction with the above description and accompanying drawings.

What is claimed is:

1. An anti-fuse circuit comprising:
an anti-fuse unit comprising an anti-fuse capable of being programmed in response to a rupture signal and configured to generate a fuse signal corresponding to a state of the anti-fuse;
a dummy fuse unit comprising a dummy fuse and configured to generate a dummy fuse signal corresponding to a state of the dummy fuse regardless of the rupture signal; and
a blocking unit configured to output the fuse signal as a fuse output signal in response to a state of the dummy fuse signal,
wherein the blocking unit is configured to output the fuse signal as the fuse output signal when the dummy fuse signal is deactivated, and deactivate the fuse output signal when the dummy fuse signal is activated.

2. The anti-fuse circuit according to claim 1, wherein the anti-fuse unit is configured to generate a deactivated fuse signal when the anti-fuse is electrically open, and generate an activated fuse signal when the anti-fuse is shorted.

3. The anti-fuse circuit according to claim 1, wherein the dummy fuse unit is configured to generate a deactivated dummy fuse signal when the dummy fuse is electrically open, and generate an activated dummy fuse signal when the dummy fuse is shorted.

4. The anti-fuse circuit according to claim 1, wherein the blocking unit comprises:
an inverter configured to invert the dummy fuse signal; and
a NAND gate configured to receive the fuse signal and an output signal of the inverter.

5. The anti-fuse circuit according to claim 1, further comprising a reset unit configured to reset the fuse output signal to a deactivated state in response to a power-up signal.

6. The anti-fuse circuit according to claim 1, further comprising an output line configured to output the dummy fuse signal to a pad.

7. An anti-fuse circuit comprising:
a first anti-fuse set comprising a first anti-fuse unit configured to generate a first fuse signal corresponding to a first anti-fuse state in response to a rupture signal and a first dummy fuse unit configured to generate a first dummy fuse signal corresponding to a first dummy fuse state regardless of the rupture signal;
a second anti-fuse set comprising a second anti-fuse unit configured to generate a second fuse signal corresponding to a second anti-fuse state in response to the rupture signal and a second dummy fuse unit configured to generate a second dummy fuse signal corresponding to a second dummy fuse state regardless of the rupture signal;
a first comparison unit configured to compare a voltage level of the first fuse signal to a reference voltage and generate a first comparison signal;
a second comparison unit configured to compare a voltage level of the second fuse signal to the reference voltage and generate a second comparison signal;
a first blocking unit configured to transmit the first comparison signal in response to a state of the first dummy fuse signal;
a second blocking unit configured to transmit the second comparison signal in response to a state of the second dummy fuse signal; and
an output unit configured to generate a fuse output signal that is activated when any one of output signals of the first and second blocking units is activated,
wherein the first blocking unit is configured to transmit the first fuse signal to the output unit when the first dummy fuse signal is deactivated, and block the transmission of the first fuse signal and output a deactivated signal when the first dummy fuse signal is activated,
wherein the second blocking unit is configured to transmit the second fuse signal to the output unit when the second dummy fuse signal is deactivated, and block the transmission of the second fuse signal and output a deactivated signal when the second dummy fuse signal is activated.

8. The anti-fuse circuit according to claim 7, wherein the first anti-fuse unit comprises a first anti-fuse capable of being programmed in response to a rupture signal, generating a deactivated first fuse signal when the first anti-fuse is electrically open, and generating an activated first fuse signal when the first anti-fuse is shorted.

9. The anti-fuse circuit according to claim 7, wherein the first dummy fuse unit comprises a first dummy fuse, capable of generating a deactivated first dummy fuse signal when the first dummy fuse is electrically open, and generating an activated first dummy fuse signal when the first dummy fuse is shorted.

10. The anti-fuse circuit according to claim 7, wherein the second anti-fuse unit comprises a second anti-fuse capable of being programmed in response to a rupture signal, generating a deactivated second fuse signal when the second anti-fuse is electrically open, and generating an activated second fuse signal when the second anti-fuse is shorted.

11. The anti-fuse circuit according to claim 7, wherein the second dummy fuse unit comprises a second dummy fuse, capable of generating a deactivated second dummy fuse signal when the second dummy fuse is electrically open, and generating an activated second dummy fuse signal when the second dummy fuse is shorted.

12. The anti-fuse circuit according to claim 7, wherein the first comparison unit is configured to generate an activated first comparison signal when the voltage level of the first fuse signal is greater than the reference voltage, and generate a deactivated first comparison signal when the voltage level of the first fuse signal is less than the reference voltage.

13. The anti-fuse circuit according to claim 7, wherein the second comparison unit is configured to generate an activated second comparison signal when the voltage level of the second fuse signal is greater than the reference voltage, and generate a deactivated second comparison signal when the voltage level of the second fuse signal is less than the reference voltage.

14. The anti-fuse circuit according to claim 7, further comprising a reset unit configured to reset the fuse output signal to a deactivated state in response to a power-up signal.

15. The anti-fuse circuit according to claim 7, further comprising an output line configured to output the first and second dummy fuse signals to a pad.

* * * * *